(12) United States Patent
Randall et al.

(10) Patent No.: US 6,964,718 B2
(45) Date of Patent: Nov. 15, 2005

(54) METHOD OF PREPARING MULTILAYERED PIEZOELECTRIC CERAMIC MATERIAL

(75) Inventors: Clive A. Randall, State College, PA (US); Amanda L. Baker, Boalsburg, PA (US); Yi Fang, State College, PA (US); Thomas Shrout, Port Matilda, PA (US); Alfons Kelnberger, Stuttgart (DE)

(73) Assignee: The Penn State Research Foundation, University Park, PA (US)

( * ) Notice: Subject to any disclaimer, the term of this patent is extended or adjusted under 35 U.S.C. 154(b) by 511 days.

(21) Appl. No.: 09/993,284

(22) Filed: Nov. 16, 2001

(65) Prior Publication Data

US 2002/0079622 A1 Jun. 27, 2002

Related U.S. Application Data

(60) Provisional application No. 60/249,133, filed on Nov. 16, 2000.

(51) Int. Cl.$^7$ .......................... C04B 37/00; C04B 33/32
(52) U.S. Cl. ............................. 156/89.16; 156/89.18; 264/619; 264/620; 29/25.35
(58) Field of Search ......................... 156/89.16, 89.18; 310/311, 358, 364; 264/619, 620; 29/25.35

(56) References Cited

U.S. PATENT DOCUMENTS

| | | | | |
|---|---|---|---|---|
| 4,863,706 A | * | 9/1989 | Wada et al. | 423/277 |
| 5,059,566 A | * | 10/1991 | Kanai et al. | |
| 5,503,787 A | * | 4/1996 | Tanei et al. | |
| 5,716,481 A | * | 2/1998 | Kobayashi et al. | 156/249 |
| 5,959,391 A | * | 9/1999 | Ogiso et al. | |
| 5,981,069 A | * | 11/1999 | Tani et al. | 428/403 |
| 6,489,257 B1 | * | 12/2002 | Hiramatsu et al. | 501/135 |

* cited by examiner

*Primary Examiner*—Christopher A. Fiorilla
(74) *Attorney, Agent, or Firm*—Ohlandt, Greeley, Ruggiero & Perle LLP

(57) ABSTRACT

Co-fired multilayer piezoelectric ceramic materials with base metal electrodes based on copper, copper alloy, are found as an effective approach to manufacture low cost multilayer piezoelectrics. The method of the invention is performed at low firing temperature and without the oxidation of base metal or reduction of ceramic components. A variety of ceramic materials may be used and copper is the preferred base metal in the multi-layer piezoelectric devices of the invention. This copper has additional protection against oxidation with a small inorganic coating on the surface. With such protection, the binder and other organics can also be efficiently removed and produce superior performance in the piezoelectric structured devices.

8 Claims, 4 Drawing Sheets

METHOD OF PREPARING MULTILAYERED PIEZOELECTRIC CERAMIC MATERIAL

This application claims priority from U.S. Provisional Application Ser. No. 60/249,133, filed Nov. 16, 2000.

BACKGROUND OF THE INVENTION

1. Field of the Invention

The present invention relates to multilayer piezoelectric ceramic materials. More particularly, the present invention relates to piezoelectric ceramics having a base metal, preferably copper, electrode. Still more particularly, piezoelectric ceramic compositions having a base metal as the electrode are cofired without oxidation of the base metal. Compositions and methods of manufacture of multilayer piezoelectric materials with base metal electrodes, preferably copper, are provided.

2. Description of the Prior Art

By way of background, multilayered piezoelectric ceramic materials have a wide variety of industrial applications. Such applications include actuators, ultrasonic transducers, voltage transformers, capacitors, and ultrasonic motors.

For these multilayered ceramics, it is well known to use noble metals such as Pd or Pt and various Ag/Pd alloys as materials for the inner electrodes. Using suitable processing conditions, the noble metals can be cofired up to 1200 degrees Celsius or even higher with the ceramics during the manufacturing process without losing their electrical properties. This is mainly due to their high oxidation resistance and high melting points. However, a great disadvantage is the high cost of noble metals, especially Pt and Pd. Ag—Pd alloys have problems with silver diffusion and electromigration under processing and high field, and high humidity operating conditions. Therefore, there is a strong need for finding low-cost solutions in the fabrication of multilayer structures, specifically actuators, especially for large scale markets, e.g. for the automotive industry. Recently, there have been successful attempts to cofire $BaTiO_3$ (BT) electronic ceramics with Ni powder as a low-cost base metal electrode material for capacitor devices, but here the sintering parameters required are severe, with relatively high, (firing temps>1200° C. and using a reducing multilayer atmosphere, less than $PO_2 \sim 10^{-10}$ atms). For piezoelectric ceramics, such as ceramics based on $Pb(Zr,Ti)O_3$(PZT) or $Pb(Mg_{1/3}Nb_{2/3})O_3$ (PMN) with very high sintering temperatures, pure base metal powders such as Ni are not suitable. In this case, copper is the base metal electrode of choice, but to this point, there have been no public reports of successful procedures for copper cofiring with piezoelectric ceramics.

There are significant problems related to the cofiring of base metals, i.e., copper, with piezoelectric materials such as $Pb(Zr,Ti)O_3$ (PZT). Such problems include removal of organic binder material without residual carbon; low firing temperatures (less than melting point of Cu=1033° C.) i.e. flux additions; firing without oxidation of base metals, for example, firing with copper as an electrode without the formation of copper oxide; firing without reduction of PZT or other ceramic material.

The present invention is directed toward finding both suitable materials and processing techniques, which allow cofiring piezoelectric ceramics, such as materials based on PZT, PMN, Bismuth based piezoelectrics, or leadfree ceramics based on $BaTiO_3$, with base metal electrodes such as Cu or Ni (or their respective alloys) in order to get high quality piezoelectric multilayer devices.

In light of current technology, there still remains a long-felt need for materials and methodology suitable for the cofiring of piezoelectric ceramic materials with base metals.

Accordingly, it is an object of the present invention to provide compositions of piezoelectric ceramics suitable for cofiring with base metals.

It is another object of the present invention to provide piezoelectric ceramic materials that can be co-fired with copper or other base metal without oxidation of the base metal and/or reduction of the ceramic.

Another object of the present invention is to provide a methods for the cofiring of piezoelectric ceramic materials with base metal electrode materials.

These and other objects and advantages of the present invention and equivalents therof, are achieved by the methods and compositions of the present invention described herein and manifest in the appended claims.

SUMMARY OF THE INVENTION

In accordance with the objects outlined above and other objects, the present invention provides methods and compositions for co-fired multilayered piezoelectric materials with base metal electrodes. The method of the invention for preparing a multilayer piezoelectric device having a base metal electrode comprises applying onto a surface a layer of piezoelectric ceramic material; applying onto said ceramic layer a first layer comprising an organic material, a flux and a dopant; applying onto said first layer a base metal powder layer wherein particles of said base metal are coated with an inorganic material and optionally a noble metal, for passivating said base metal; applying onto said base metal layer a second layer comprising an organic material, a flux and a dopant; and optionally repeating the aforesaid step; and applying onto said second layer a layer of piezoelectric ceramic material to produce a multilayer structure; thereafter heating said multilayer structure at a temperature from about 350° C. to about 500° C. and under partial pressure of oxygen of from $10^{-4}$ atm to ambient atm to remove organic material; and sintering said multilayer structure at a temperature from about 600° C. to about 1050° C. aat a partial pressure of oxygen from about $10^{-3}$ to $10^{-10}$ atm to produce said multilayer piezoelectric device having a base metal electrode. Novel compositions are prepared by the method of the invention. The preferred base metal electrode is copper.

The invention discloses a process for preparing a multilayer piezoelectric device with alternating piezoelectric ceramic layers and base metal layers as electrodes comprising the steps of: applying onto a first layer, which includes a piezoelectric ceramic material and a first combination of organic materials , a second layer, which includes a base metal powder having particles, which are coated with material capable of protecting said base metal against oxidation, and a second combination of organic materials, to produce a first structure; applying onto said first structure a second structure, which is identical to said first structure to produce a multilayer structure; heating said multilayer structure at a temperature less than 600° C. to remove said first and second combinations of organic materials and their decomposition products such as carbon to levels below 200 ppm; and thereafter sintering at a temperature from about 600° C. to about 1050° C. at a partial pressure of oxygen from about $10^{-3}$ to $10^{-15}$ atm to produce said multilayer piezoelectric device with alternating piezoelectric ceramic layers and base metal layers as electrodes. The method may include a cool-down step of said sintering at a partial pressure of oxygen below $10^{-4}$. This is advantageous using PZT as ceramic material as PbO does not get reduced because it is sintered dense and thus protected while Cu is protected because of the low $PO_2$. Base metals may conveniently be selected from Cu, Ni and alloys thereof The first combination of organic materials includes binder, solvents, plasticizers, dispersants, and combinations thereof. Base metal coating to protect against oxidation may conveniently be selected from glasses, metal oxides, organic material, noble metals, and combinations thereof. The second combination of organic materials includes solvents, binder, and combinations thereof. Heating is at a partial pressure of oxygen from about $10^{-4}$ atm to ambient atm and at a temperature from about 25° C. to about 500° C. Multilayer piezoelectric devices with alternating piezoelectric ceramic layers and base metal layers as electrodes may be prepared by the method of the present invention. Ceramic material may be selected from PZT, PMN, bismuth-based piezoelectric materials, and lead-free ceramics based on $BaTiO_3$. A wide variety of piezoelectric devices with alternating piezoelectric ceramic layers and base metal layers as electrodes may conveniently be prepared by the process of the present invention.

DETAILED DESCRIPTION OF THE INVENTION

Figure 1:
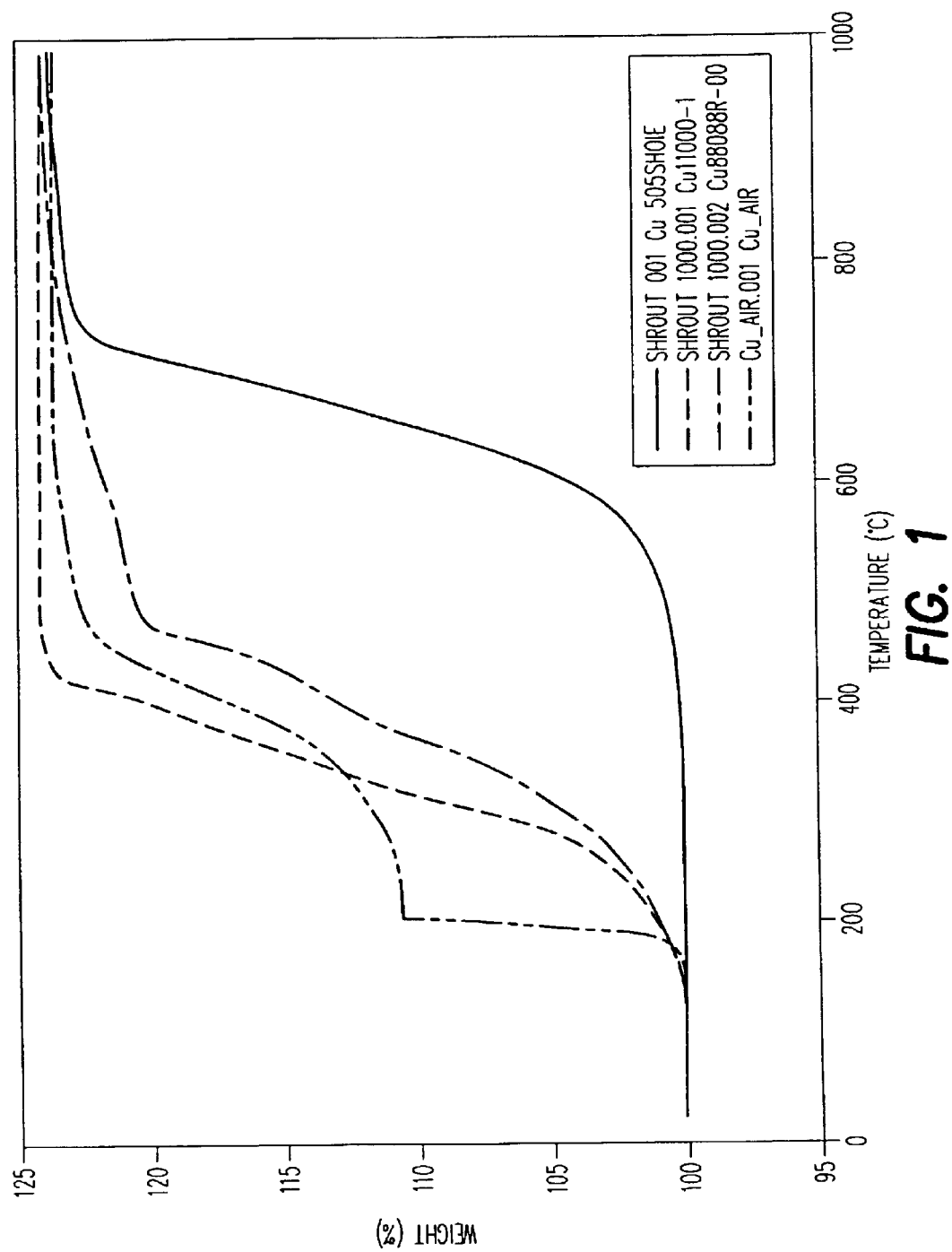
FIG. 1 shows a thermograviatational analysis of various copper powders in air as a function of temperature. Note the retaradation of copper oxidation for a passivated copper powder (Shoei).

In its most general form, the present invention provides piezoelectric ceramic compositions having base metal electrodes and methods for their manufacture. Piezoelectric ceramic compositions are co-fired with base metal electrodes, preferably copper, without oxidation of the base metal or reduction of the ceramic.

The present invention is mainly characterized in that the base metal oxidation, which usually starts at temperatures around 200° C. and above, is retarded by appropriate protection mechanisms, such that binder is removed with limited residual carbon in $PO_2 \sim 10^{-4}$ Pa to Air. By coating the base metal powders, e.g. with a very thin inorganic phases such as $B_2O_3$, $SiO_2$, $Al_2O_3$, and metals Pd, Pt, etc., copper oxidation can be retarded to temperatures up to 500° C. Thus the debinding of the multilayer, i.e. the pyrolysis of the organic components in the multilayer, can be performed without Cu oxidation. Having the appropriate reduction resistant ceramics, the sintering up to temperatures around 1100° C. of the device can be performed in a reducing atmosphere where no copper oxidation takes place. During this sintering process the glass coating is gradually melting and high quality copper electrodes are formed.

Another important aspect of the invention is the lowering of the sintering temperature of e.g., PZT compositions, by the addition of fluxes. There are a number of fluxes that can be applied to PZT, including $Cu_2O$, $V_2O_5$, etc., to lower the sintering temperature below the melting point of copper.

It is of great advantage if the ceramic compositions are further modified to improve the reduction resistance of the ceramic. This can be established with addition of dopants such as CaO, $Y_2O_3$, MnO, and the like. For PZT, additives such as calcium, prove to be effective in $PO_2 \sim 10^{-6}$ to $10^{-9}$ atmospheres (atms) at 800° C. to 1100° C. This is important because of the above mentioned necessity of performing the sintering process in a reducing atmosphere. Additives limit the reduction of the PZT, and also aid degradation resistance of the ceramics.

According to the invention, advantageous reducing atmospheres can be either mixtures of dry or wet reducing gasses with partial pressures between $10^{-8} \leq PO_2 \leq 10^{-3}$ atms, for the firing and removal of the binder in air down to $PO_2 \sim 10^{-4}$ atms.

In the total processing of the multilayer structures, there are three main stages. The first stage is green body assembly. This stage involves use of tape casting and screen printing technology and those variants known in the art that build up alternating layers of piezoelectric ceramics and copper electrode layers. The materials of the piezoelectric can be PZT, or any other suitable piezoelectric ceramic, added with appropriate fluxes such as $V_2O_5$, low melting glasses, and $BaCuO_3$. These powders are formed into layers with the aid of organics such as dispersants, plasticizers, and binders known in the art.

The second stage of the processing of the multilayer structures of the invention is referred to as debinding. This stages requires a pyrolysis of the organic phase with limited oxidation of the copper metal powders. The copper metal, or other base metal, selected in this invention is coated with a thin glass phase to limit oxidation in the binder removal stage. With such oxidation resistance powders the binder burnout or debinding can occur at temperatures between 350° C. and 500° C. in partial pressures of oxygen from about $10^{-4}$ atm to ambient conditions.

The third stage of the processing of the multilayer structures of the invention involves the co-sintering of the piezoelectric and the copper or other bases metal electrodes. This can be performed at temperatures from about 600° C. to about 1050° C., and at $PO_2 \sim 10^{-3}$ to $10^{-10}$ atms.

FIG. 1 shows effective binder removal without copper oxidation.

Figure 2:
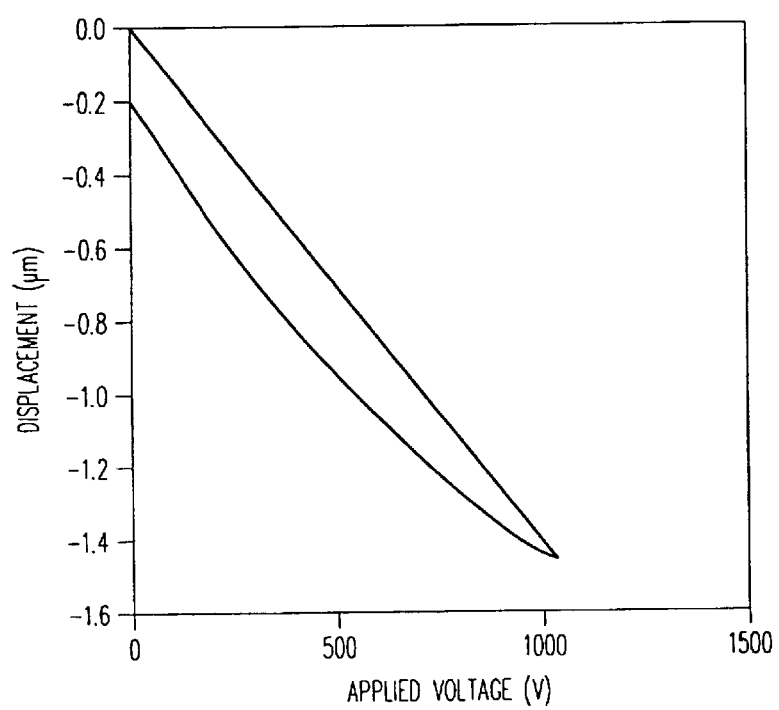
FIG. 2 is a transverse strain displacement of a polarized co-fired copper multilayer actuator (PZT+flux) prepared by tape casting.
Figure 3:
FIG. 3 is a scanning electron microscope (SEM) photomicrograph of a fracture surface of a Cu-cofired PZT multilayer actuator.
Figure 4:
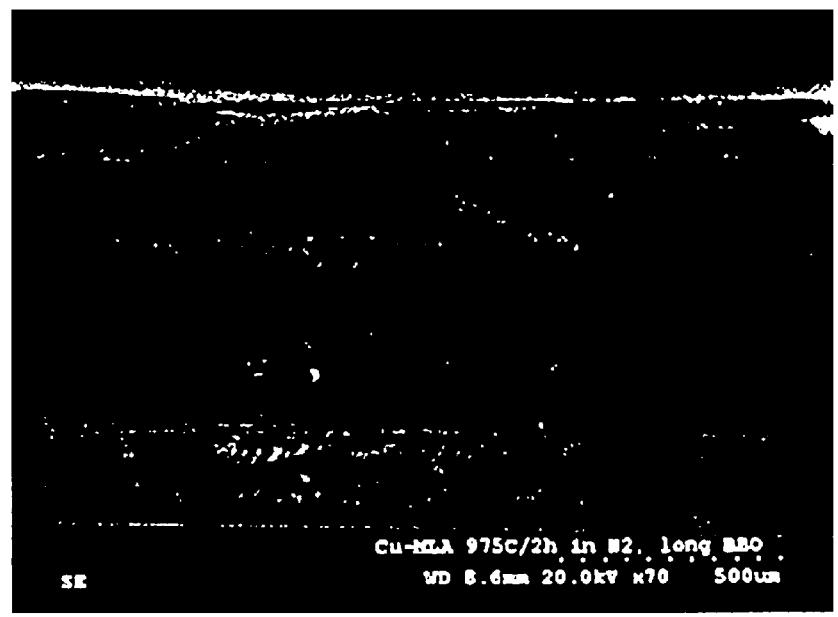
FIG. 4 is a SEM cross-section of a copper, PZT co-fired multilayered actuator.

FIG. 2 is a graph showing the transverse strain displacement of a polarized co-fired copper multilayer actuator (PZT+flux) prepared by tape casting. FIG. 4 shows a cross-section of the copper, PZT co-fired multilayer actuator the strain field behavior of which is shown in FIG. 2.

Multilayer devices with piezoelectric ceramics, such as PZT, are conveniently co-fired with base metal electrodes using processing of the invention such that oxidation of the base metal powders is suppressed, or retarded, by appropriate coating techniques. The base metal powders are passivated with coated surfaces to enhance oxidation resistance, e.g. with inorganic coatings including but not limited to $SiO_2$, $Al_2O_3$, $B_2O_3$, and the like. Fluxed piezoelectric ceramics using lower sintering temperatures, i.e., to <1050° C., are processed in reducing atmospheres, including but not limited to fluxes such as $V_2O_5$, $BaCuO_3$ and tungstates, $Cd$—$SiO_2$, and the like. Additives useful to improve reduction resistance of piezoelectric material include but are not limited to CaO, $Y_2O_3$, $Ho_2O_3$, MnO, MgO, and $Dy_2O_3$. Preferred processing conditions include reducing atmospheres, dry and wet gases with $PO_2$ from 1 atm to $10^{-8}$ atm. The cofiring of base metal multilayers with high performance piezoelectric characteristics are useful for applications including, but not limited to, actuators, ultrasonic transducers and transformers.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

What is claimed is:

1. A method of preparing a multilayer piezoelectric device with alternating piezoelectric ceramic layers and base metal layers as electrods comprising the steps of:
   (a) applying onto a first layer, which includes a piezoelectric ceramic material selected from the group consisting of PZT, PMN, bismuth-based piezoelectric materials, and lead-free ceramics based on $BaTiO_3$ and a first combination of organic materials, a second layer, which includes a base metal powder having particles, which are coated with material capable of protecting said base metal against oxidation, and a second combination of organic materials, to produce a first structure;
   (b) applying onto said first structure a second structure, which is identical to said first structure to produce a multilayer structure;
   (c) heating said multilayer structure at a temperature less than 600° C. to remove said first and second combinations of organic materials and their decompisition products to levels below 200 ppm; and thereafter
   (d) sintering at a temperature from about 600° C. to about 1050° C. at a partial pressure of oxygen from about $10^{-3}$ to $10^{-15}$ atm to produce said multilayer piezoelectric ceramic layers and base metal layers as electrodes.

2. The method of claim 1, wherein said base metal is selected from the group consisting of Cu, Ni and alloys thereof.

3. The method of claim 1, wherein said first combination of organic materials includes binder, solvents, plasticizers, dispersants, and combinations thereof.

4. The method of claim 1, wherein said base metal coating to protect against oxidation is selected from the group consisting of glasses, metal oxides, organic material, noble metals, and combinations thereof.

5. The method of claim 1, wherein said second combination of organic materials includes solvents, binder, and combinations thereof.

6. The method of claim 1, wherein said heating is at a partial pressure of oxygen from about $10^{-4}$ atm to ambient atm.

7. The method of claim 1, wherein said heating is at a temperature from about 25° C. to about 500° C.

8. A method of preparing a multilayer piezoelectric device with alternating piezoelectric ceramic layers and base metal layers as electrodes comprising the steps of:
   (a) applying onto a first layer, which includes a piezoelectric ceramic material selected from the group consisting of PZT, PMN, bismuth-based piezoelectric materials, and lead-free ceramics based on $BaTiO_3$ and a first combination of organic materials, a second layer, which includes a base which includes a base metal powder having particles, which are coated with material capable of protecting said base metal against oxidation, and a second combination of organic materials, to produce a first structure;
   (b) applying onto said first structure a second structure, which is identical to said first structure to produce a multilayer structure;
   (c) heating said multilayer structure at a temperature less than 600° C. to remove said first and second combinations of organic materials and their decompisition products to levels below 200 ppm; therafter
   (d) sintering at a temperature from about 600° C. to about 1050° C. at a partial pressure of oxygen from about $10^{-3}$ to $10^{-15}$ atm to produce said multilayer piezoelectric device with alternating piezoelectric ceramic layers and base metal layers as electrodes; and
   (e) cooling-down after said sintering step at a partial pressure of oxygen below $10^{-4}$ atm.

* * * * *